(12) United States Patent
Lin

(10) Patent No.: US 12,270,230 B2
(45) Date of Patent: Apr. 8, 2025

(54) COVER STRUCTURE OF CONTROL BOX

(71) Applicant: TIMOTION TECHNOLOGY CO., LTD., New Taipei (TW)

(72) Inventor: Yu-Chang Lin, New Taipei (TW)

(73) Assignee: TIMOTION TECHNOLOGY CO., LTD., New Taipei (TW)

( * ) Notice: Subject to any disclaimer, the term of this patent is extended or adjusted under 35 U.S.C. 154(b) by 281 days.

(21) Appl. No.: 17/860,983

(22) Filed: Jul. 8, 2022

(65) Prior Publication Data
US 2023/0392415 A1 Dec. 7, 2023

(51) Int. Cl.
*E05B 65/00* (2006.01)
*E05B 15/04* (2006.01)
*H05K 5/03* (2006.01)

(52) U.S. Cl.
CPC ............ *E05B 65/006* (2013.01); *E05B 15/04* (2013.01); *H05K 5/03* (2013.01)

(58) Field of Classification Search
CPC ......... E05B 65/006; E05B 15/04; H05K 5/03; E05C 3/00; E05C 3/04; E05C 3/002
USPC .......................................................... 70/216
See application file for complete search history.

(56) References Cited

U.S. PATENT DOCUMENTS

| | | | | |
|---|---|---|---|---|
| 2,852,926 A * | 9/1958 | Chervenka | ............ | E05B 65/025 70/79 |
| 2,873,134 A * | 2/1959 | Ahlgren | ................. | E05C 3/041 292/DIG. 20 |
| 3,916,657 A * | 11/1975 | Steinbach | ............. | E05B 27/083 70/338 |
| 7,699,364 B2 * | 4/2010 | Tang | ...................... | G06F 1/1679 292/210 |
| 8,955,255 B2 * | 2/2015 | DeBoer | ..................... | E05C 1/12 49/176 |
| 2003/0205903 A1 * | 11/2003 | Kelley | ................ | E05B 65/0876 292/241 |
| 2019/0338569 A1 * | 11/2019 | Manly | ........................ | E05C 5/02 |
| 2023/0113402 A1 * | 4/2023 | Klockow | ............. | A61G 11/006 5/97 |

FOREIGN PATENT DOCUMENTS

| CN | 110017065 A | * | 7/2019 | |
|---|---|---|---|---|
| CN | 218234693 U | * | 1/2023 | |
| WO | WO-2011077727 A1 | * | 6/2011 | ......... E05B 17/0033 |

* cited by examiner

*Primary Examiner* — Kristina R Fulton
*Assistant Examiner* — James Edward Ignaczewski
(74) *Attorney, Agent, or Firm* — Chun-Ming Shih; HDLS IPR SERVICES

(57) ABSTRACT

A cover structure of a control box is disclosed. The control box includes a base with a limiting part, the cover structure includes a cover body, a knob and a torsion spring, the cover body is connected to the base, the knob is rotatably connected to the cover body and has a stop arm stopped at the limiting part, two ends of the torsion spring are fixed to the cover body and the knob respectively to generate a pre-torque. When the knob is rotated by an external force, the stop arm is released from the limiting part to unlock the cover structure from the base, and when the external force is removed, the knob restores to original position by the pre-torque. Therefore, the cover structure may be removed from the base quickly to facilitate an operator's use and maintenance.

10 Claims, 10 Drawing Sheets

COVER STRUCTURE OF CONTROL BOX

BACKGROUND OF THE DISCLOSURE

Technical Field

The technical field relates to a cover structure, and more particularly relates to a cover structure that may be assembled and disassembled quickly.

Description of Related Art

As the industrial development is booming, linear actuators are used extensively in homes, workplaces, medical institutions and agricultural fields, and the control of the linear actuators is through a hand controller operated by users, and a control box is provided for controlling the operation of the linear actuators according to the users' operation. The control box mainly includes a box body, a plurality of signal lines connected to the box body, and a cover plate installed to the box body and provided for covering each signal line to prevent the signal line from falling off or the moisture and dust from entering into the box body.

However, the cover plate is generally locked onto the box body by a plurality of bolts, so that it is not only cumbersome and time-consuming for disassembly and assembly, but also has a concern of losing the bolts easily during the disassembly and assembly processes which require a tool for the operation. How to lock the cover plate to the box body for an easy disassembly or assembly demands immediate attentions and feasible solutions.

In view of the aforementioned problems, the discloser proposed this disclosure based on his expert knowledge and elaborated researches to overcome the problems of the related art.

SUMMARY OF THE DISCLOSURE

The primary objective of this disclosure is to disassemble/assemble the cover structure from/to the base quickly to facilitate an operator's use and maintenance.

To achieve the aforementioned objective, this disclosure discloses a cover structure of a control box. The control box includes a base having a limiting part, and the cover structure includes a cover body, a knob, and a torsion spring. The cover body is movably connected to the base, and the knob is rotatably connected to the cover body, and the knob has a stop arm stopped at the limiting part, and the torsion spring includes a main body, a first arm extended from an end of the main body and a second arm extended from another end of the main body. The first arm is fixed to the cover body, and the second arm is fixed to the knob, and a pre-torque is being generated at the main body. When the knob is rotated by an external force, the stop arm is released from the limiting part to unlock the cover structure from the base. When the external force is removed, the knob restores to an original position by the pre-torque.

This disclosure has the following effects. The stop structure on the inner wall of the base and the limiting plate at the inner edge of the cover body are clamped to each other, so that the cover body may only move along the longitudinal direction of the base. Each elastic hook passes through the slotted hole and then snaps to the bottom of the cover body, such that the knob is connected to the cover body. Through the guide surface inside the stop arm, the stop arm may be elastically deformed and move along the limiting part until snapping to position. The cover structure of this disclosure may be installed and removed without using screws, thereby making the manufacturing process simpler and faster.

DETAILED DESCRIPTION

Figure 1:
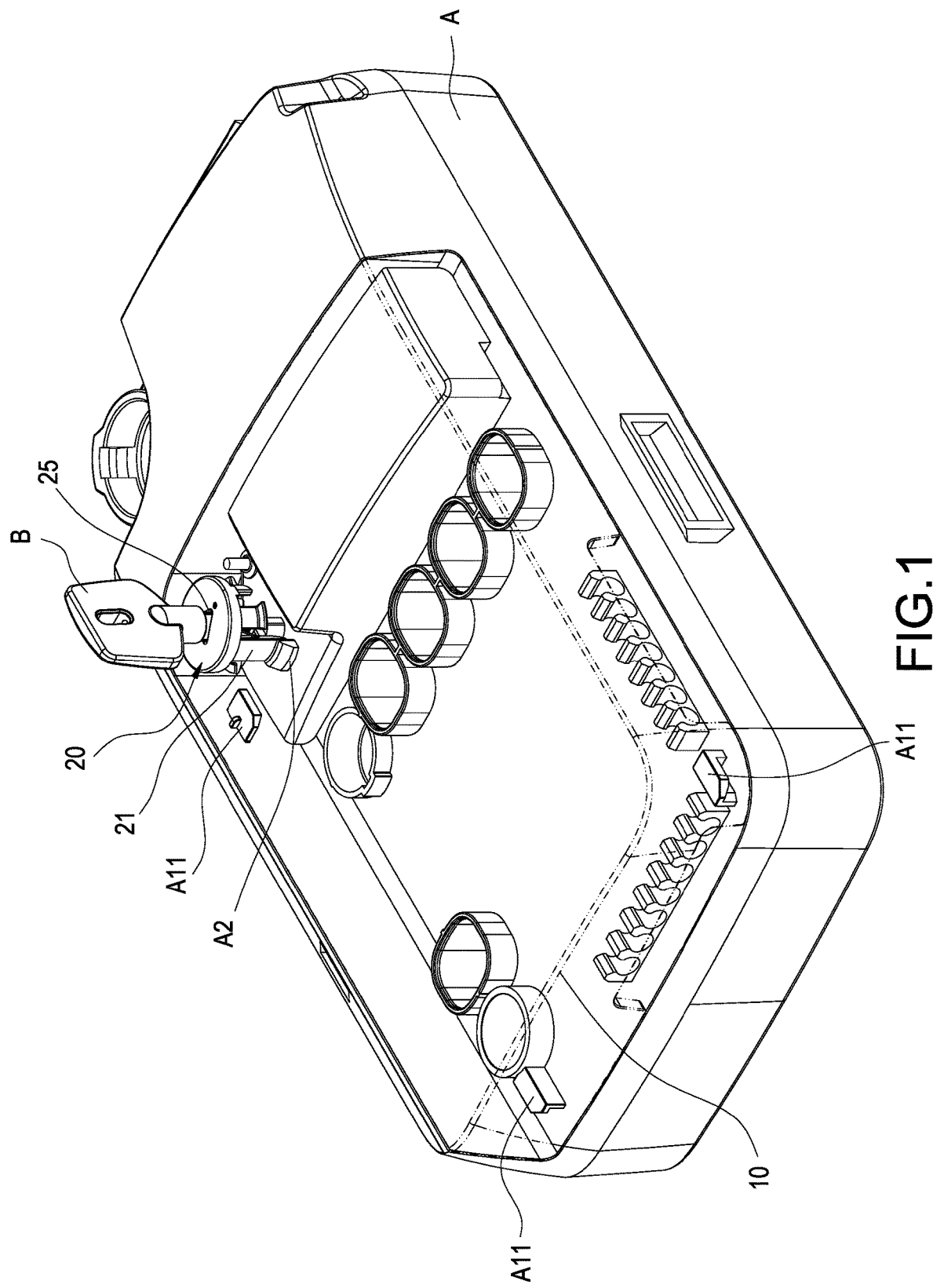
FIG. 1 is a perspective view of this disclosure with a base.
Figure 2:
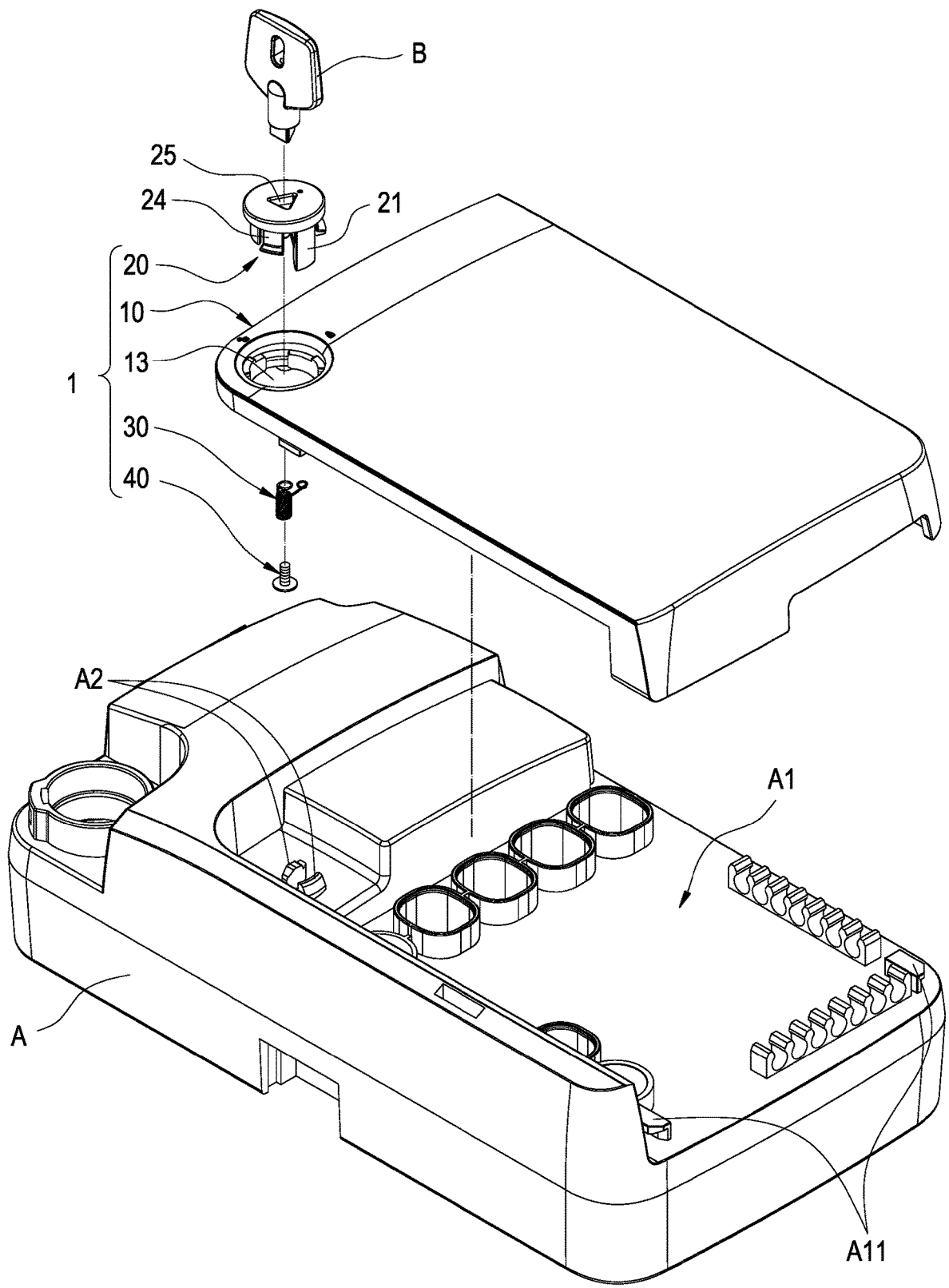
FIG. 2 is an exploded view of this disclosure with the base.
Figure 3:
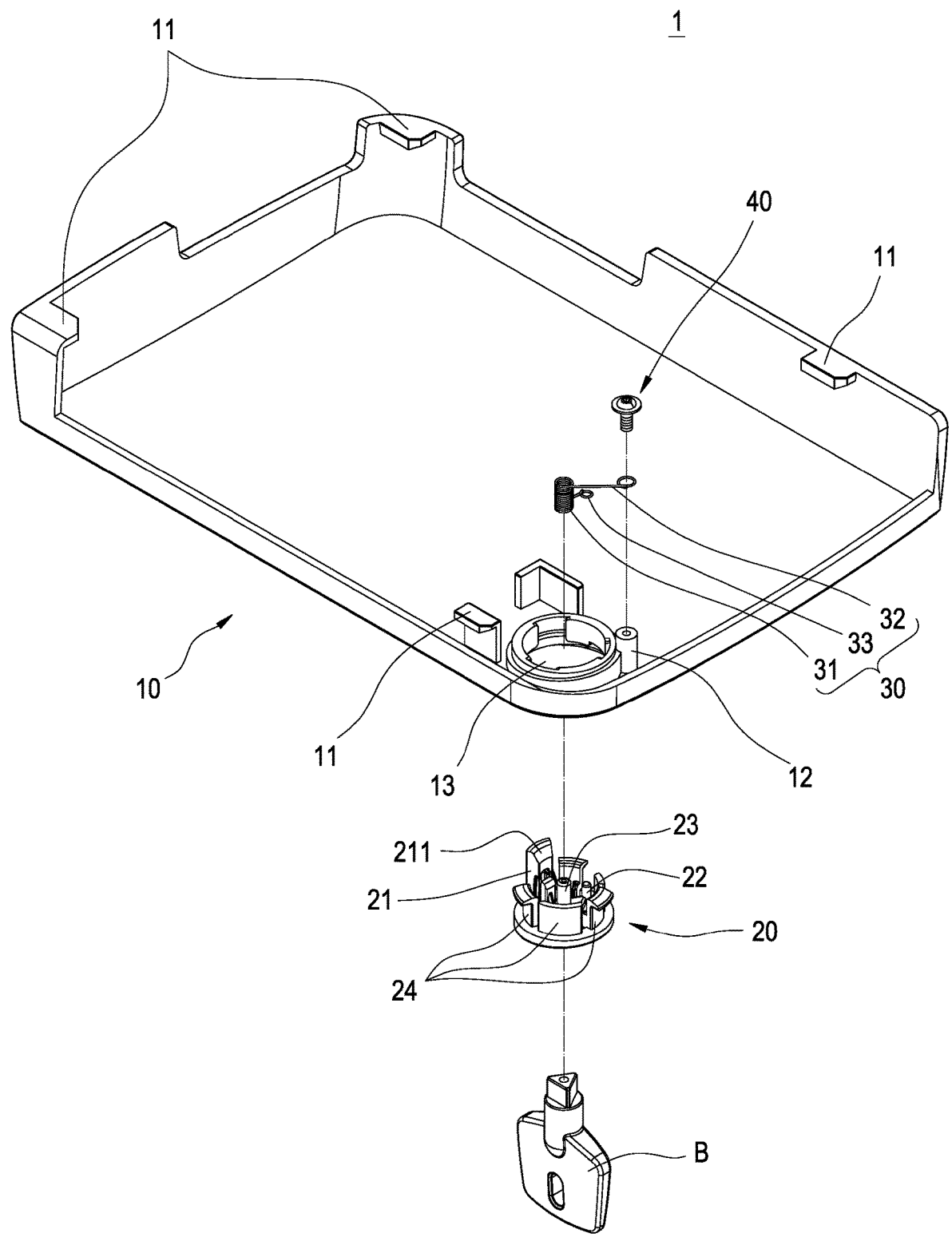
FIG. 3 is an exploded view of this disclosure.

The technical contents of this disclosure will become apparent with the detailed description of embodiments accompanied with the illustration of related drawings as follows. It is intended that the embodiments and drawings disclosed herein are to be considered illustrative rather than restrictive.

This disclosure provides a cover structure 1 of a control box, and the control box includes a rectangular base A, and the base A has an accommodation groove A1 and a limiting part A2, and the limiting part A2 is disposed in the accommodation groove A1. In FIGS. 1 to 5, the cover structure 1 mainly includes a cover body 10, a knob 20 and a torsion spring 30.

The cover body 10 is substantially plate-shaped, and may be made of plastic or metal. It is noteworthy that this disclosure is not just limited to the above materials only, but may be adjusted according to design requirements. The cover body 10 is movably connected to the base A and covers the accommodation groove A1. Specifically, the cover body 10 may move along the longitudinal direction of the base A to cover or expose the accommodation groove A1. In this embodiment, the base A has a plurality of stop structures A11 convexly formed on the inner wall of the accommodation groove A1 and a plurality of limiting plates 11 convexly formed on the inner wall of the cover body and each limiting plate 11 snaps to each corresponding stop structure A11 to limit the cover body 10 to move in the longitudinal direction of the base A only, but this disclosure is not limited to such arrangement only.

The knob 20 is rotatably connected to the cover body 10. The knob 20 has a stop arm 21 in arc-shaped and accommodated in the accommodation groove A1, and the stop arm 21 is stopped at the limiting part A2. In this embodiment, the limiting part A2 is an arc wall, disposed on the outer side of the stop arm 21 and may stop the knob 20 along the longitudinal direction of the base A. In some embodiments, the limiting part A2 includes two arc walls arranged on the inner and outer sides of the stop arm 21 respectively to limit the stop arm 21 in the arc gap between the two arc walls.

The torsion spring 30 includes a main body 31, a first arm 32 extended from an end of the main body 31 and a second arm 33 extended from another end of the main body 31. The main body 31 is adapted to sheathe the knob 20, and the first arm 32 is fixed to the cover body 10, and the second arm 33 is fixed to the knob 20, and a pre-torque is being generated by the main body 31 of the torsion spring 30. Specifically, the cover body 10 has a stud 12 for fixing the first arm 32, and the knob 20 has a fixed column 22 to be sheathed by the second arm 33. In some embodiments of this disclosure, the cover structure 1 further includes a bolt 40 passing through the first arm 32 and then locked into the stud 12 to fix the torsion spring 30 onto the cover body 10, but this disclosure is not limited to such arrangement only.

Further, the center of the knob 20 has a mounting column 23 to be sheathed by the main body 31 of the torsion spring 30. In addition, the cover body 10 has a slotted hole 13 for the knob 20 to pass through, and the knob 20 has a plurality of elastic hooks 24 circularly disposed around the outer periphery of the mounting column 23. The elastic hooks 24 pass through the slotted hole 13 to jointly snap to the bottom of the cover body 10 to connect the knob 20 to the cover body 10. Specifically, the fixed column 22 is disposed on a side of the mounting column 23, and each elastic hook 24 and the stop arm 21 are circularly disposed around the mounting column 23.

Figure 6:
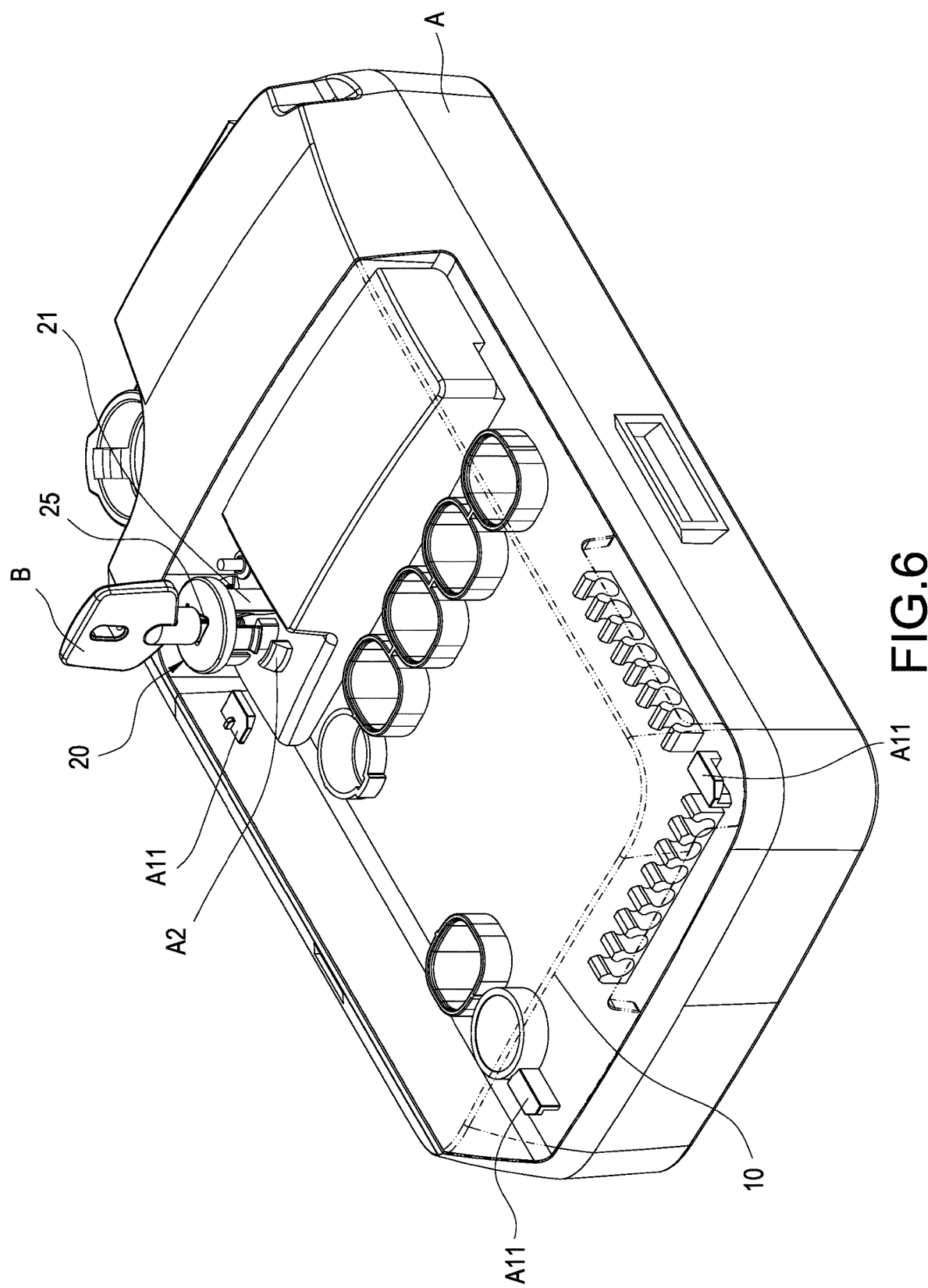
FIG. 6 is a perspective view of this disclosure which is unlocked from the base.
Figure 7:
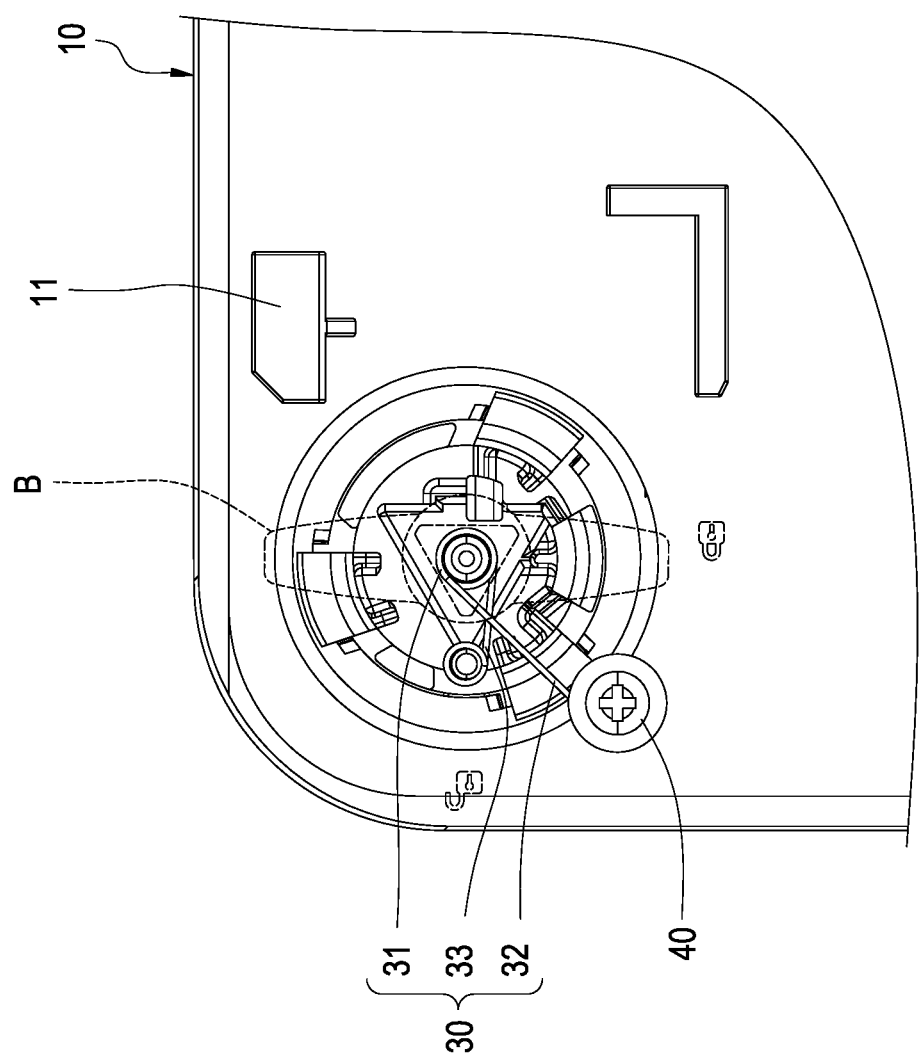
FIG. 7 is a partial bottom view of this disclosure which is unlocked from the base.
Figure 8:
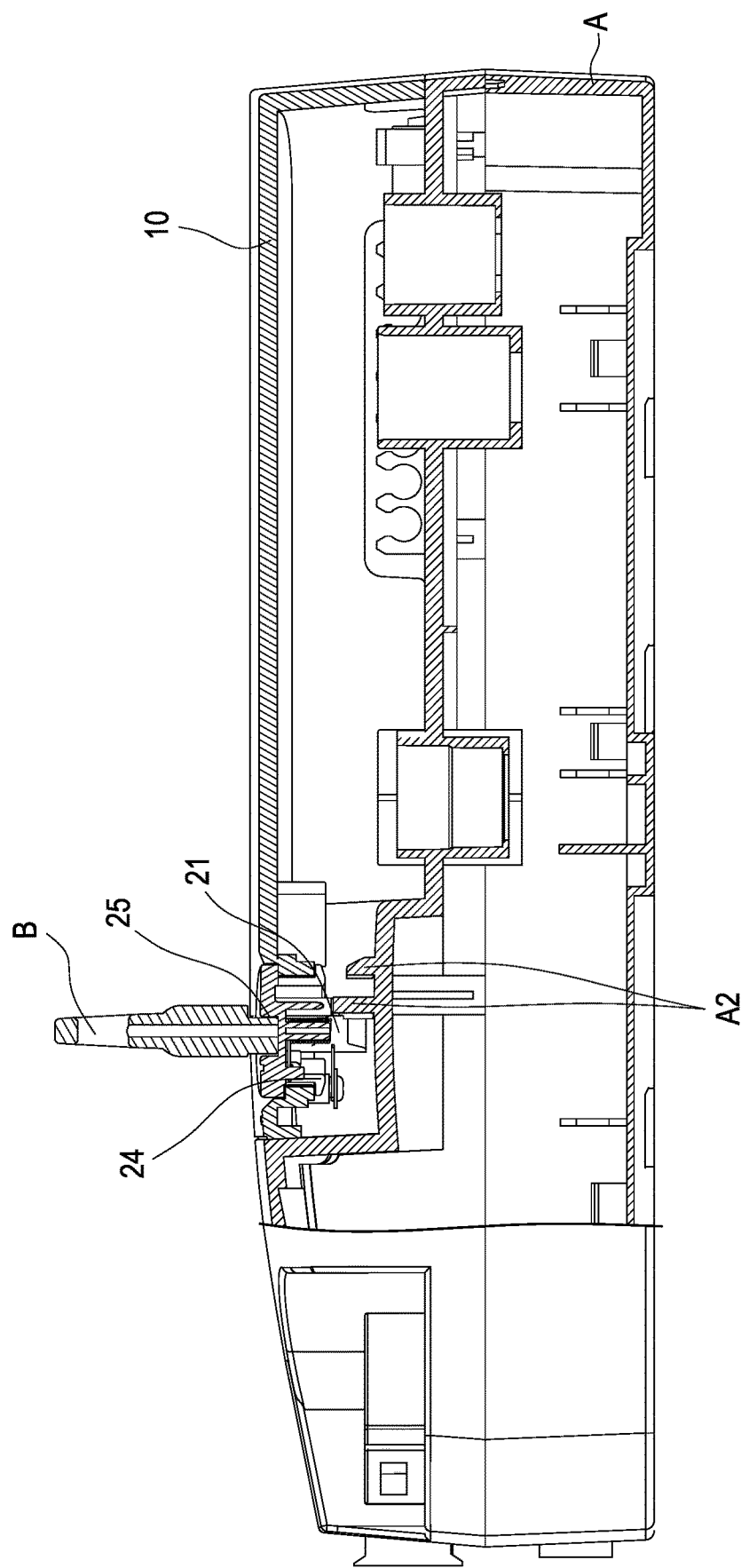
FIG. 8 is a cross-sectional view of this disclosure which is unlocked from the base.

With reference to FIGS. 6 to 8 for the unlocked status of the cover structure 1 in accordance with an embodiment of this disclosure, the knob 20 has a key slot 25 for a key B to be inserted and snapped to rotate the knob 20 for avoiding an accidental touch or operation by unrelated persons. The knob 20 of this disclosure is not limited to such arrangement only, but it can also have a turning handle provided for a user's finger to turn the knob 20 to rotate the knob 20 directly. When the knob 20 is rotated by an external force, the torsion spring 30 produces an elastic deformation to increase the torque, and the stop arm 21 slides along the gap between the two arc walls until it is released from each arc wall, such that the cover structure 1 is unlocked from the base A of the control box to allow the cover body 10 to move along the longitudinal direction of the base A and expose the accommodation groove A1.

Figure 4:
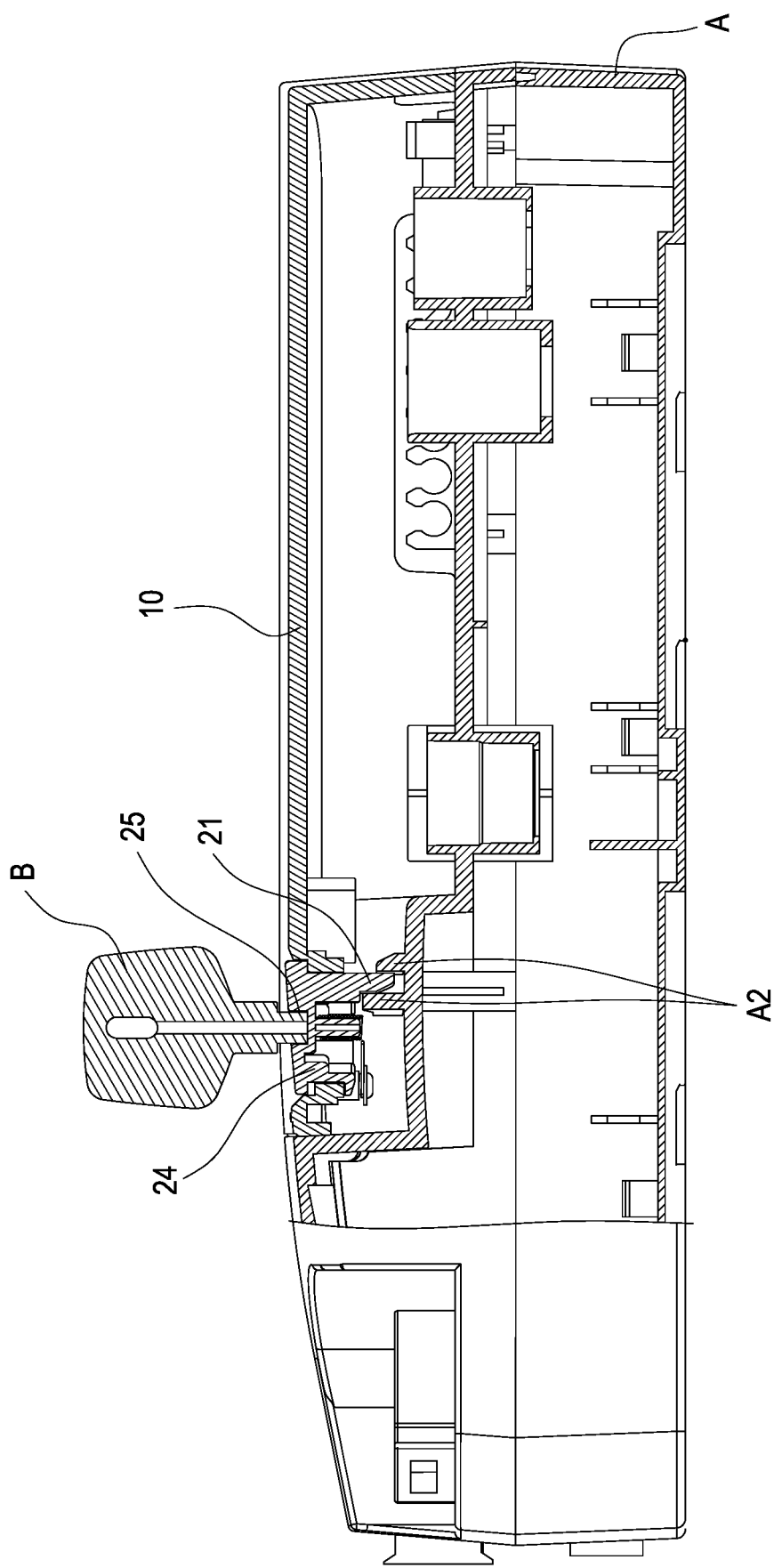
FIG. 4 is a cross-sectional view of this disclosure which is locked to the base.
Figure 5:
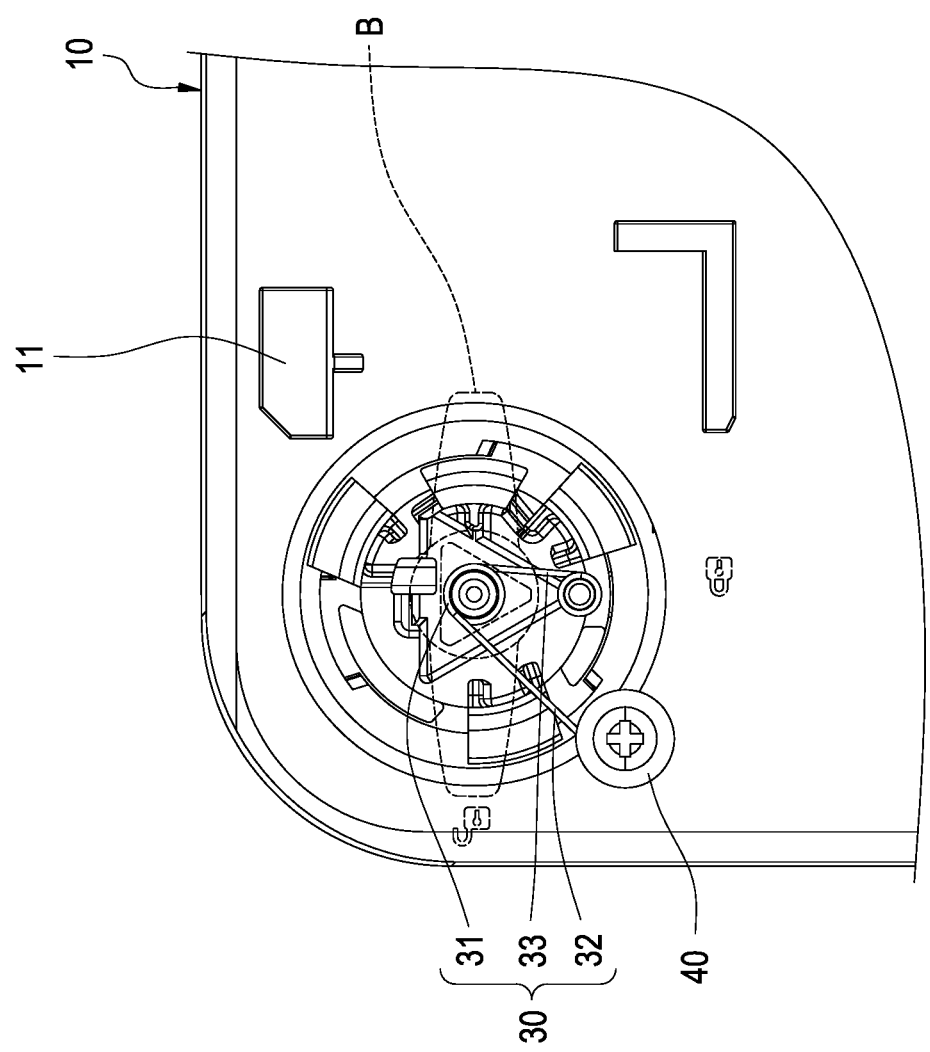
FIG. 5 is a partial bottom view of this disclosure which is locked to the base.

In FIGS. 1, 4 and 5, when the external force is removed, the knob 20 is pushed to restore to the original position by the torque of the elastic deformation and the pre-torque of the torsion spring 30, and makes the stop arm 21 slide into the gap between the two arc walls to limit the stop arm 21 between the two arc walls, so as to stop the cover body 10 and prevent it from moving along the longitudinal direction of the base A.

Figure 9:
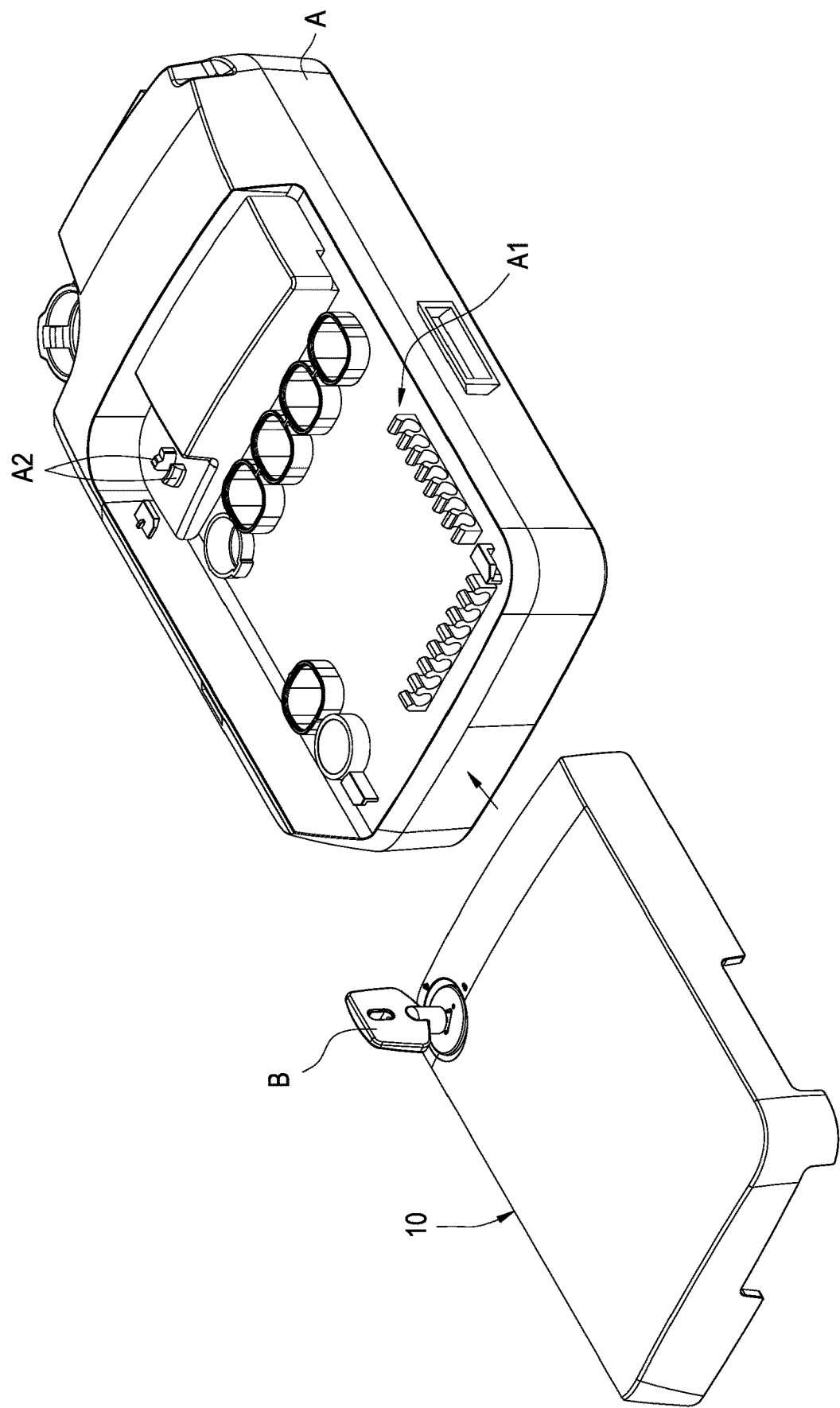
FIG. 9 is a first schematic view of this disclosure which is installed to the base.
Figure 10:
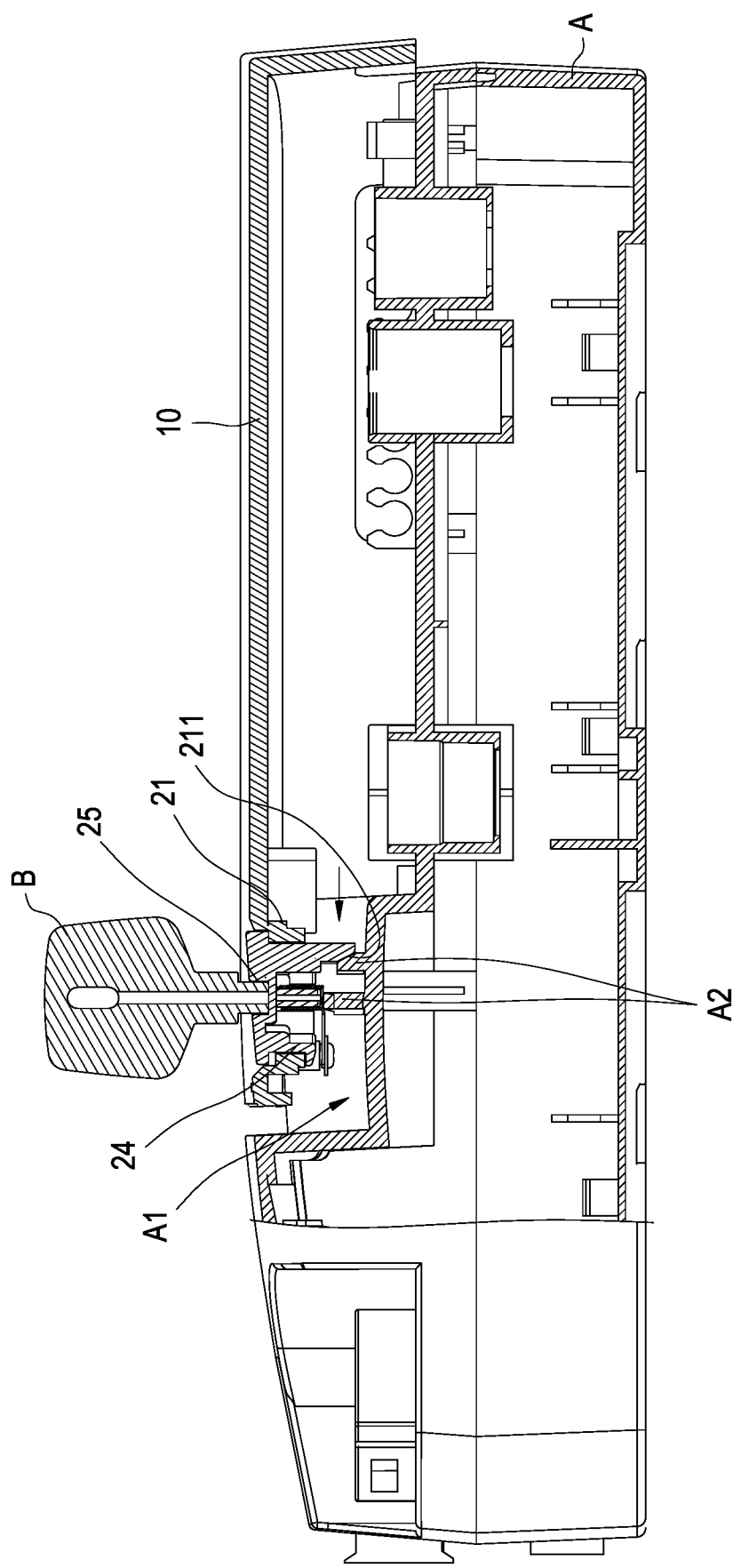
FIG. 10 is a second schematic view of this disclosure which is installed to the base.

In addition, the inner side of the stop arm 21 is provided with a guide surface 211. In this embodiment, a chamfer is formed in the limiting part A2 and disposed at the top of the arc wall on the outer side of the stop arm 21, and the chamfer is disposed at a side away from the stop arm 21 to be corresponding to the guide surface 211. In FIGS. 9 and 10, when the cover structure 1 of this disclosure is installed to the base A, the guide surface 211 of the stop arm 21 is attached to the chamfer of the arc wall, such that the stop arm 21 is elastically deformed and moves along the chamfer until the stop arm 21 is snapped and fixed into the two arc walls. In this way, the cover structure 1 may be quickly installed onto the base A without turning the knob 20, and the cover structure 1 may be disassembled in the reverse direction.

While this disclosure has been described by means of specific embodiments, numerous modifications and variations could be made thereto by those skilled in the art without departing from the scope and spirit of this disclosure set forth in the claims.

What is claimed is:

1. A cover structure of a control box of a linear actuator, and the control box comprising a base, and the base comprising an accommodation groove and a limiting part, the limiting part disposed in the accommodation groove, and the cover structure comprising:
    a cover body, movably coupled to the base along a longitudinal direction to cover the accommodation groove, and the longitudinal direction parallel to the base and the cover body;
    a knob, rotatably coupled to the cover body, and comprising a stop arm stopped at the limiting part, wherein the stop arm extending from the knob is perpendicular to the cover body and the longitudinal direction; and
    a torsion spring, comprising a main body, a first arm extended from an end of the main body, and a second arm extended from another end of the main body, and the first arm fixed to the cover body, and the second arm fixed to the knob, wherein a pre-torque is being generated at the main body;
    wherein when the knob is rotated by an external force, the stop arm is released from the limiting part to unlock the cover structure from the base, and when the external force is removed, the knob restores to an original position by the pre-torque.

2. The cover structure according to claim 1, wherein the stop arm comprises a guide surface.

3. The cover structure according to claim 1, wherein the stop arm comprises a cross-section substantially in an arc shape.

4. The cover structure according to claim 1, wherein the knob comprises a mounting column, and the main body is adapted to sheathe the mounting column.

5. The cover structure according to claim 1, further comprising a bolt, and the cover body comprising a stud, and the bolt passing through the first arm and locked to the stud.

6. The cover structure according to claim 1, wherein the knob comprises a fixed column, and the second arm is adapted to sheathe the fixed column.

7. The cover structure according to claim 1, wherein the cover body comprises a slotted hole, and the knob comprises a plurality of elastic hooks, and each of the elastic hooks passing through the slotted hole to jointly snapped on the cover body.

8. The cover structure according to claim 7, wherein the knob comprises a mounting column, and the main body is adapted to sheathe the mounting column, and the stop arm and each of the elastic hooks are disposed circularly around the mounting column.

9. The cover structure according to claim 1, wherein the knob comprises a key slot.

10. The cover structure according to claim 1, wherein the knob comprises a turning handle.

* * * * *